United States Patent [19]
Takahashi

[11] Patent Number: 5,879,845
[45] Date of Patent: Mar. 9, 1999

[54] PROJECTION EXPOSURE METHOD UTILIZING CORRECTION FOR CHANGE IN OPTICAL CHARACTERISTIC

[75] Inventor: Kazuhiro Takahashi, Utsunomiya, Japan

[73] Assignee: Canon Kabushiki Kaisha, Tokyo, Japan

[21] Appl. No.: 121,594

[22] Filed: Jul. 24, 1998

Related U.S. Application Data

[62] Division of Ser. No. 701,331, Aug. 23, 1996, Pat. No. 5,801,815.

[30] Foreign Application Priority Data

Aug. 29, 1995 [JP] Japan ..................................... 7-242314

[51] Int. Cl.$^6$ .................................. G03F 9/00; G03C 5/00
[52] U.S. Cl. ................................................................ 430/30
[58] Field of Search ................................. 430/30; 355/30, 355/53, 55, 67

[56] References Cited

U.S. PATENT DOCUMENTS

| | | |
|---|---|---|
| 4,595,282 | 6/1986 | Takahashi . |
| 4,617,469 | 10/1986 | Takahashi et al. . |
| 4,659,225 | 4/1987 | Takahashi . |
| 4,825,247 | 4/1989 | Kemi et al. . |
| 4,874,954 | 10/1989 | Takahashi et al. . |
| 5,365,342 | 11/1994 | Ayata et al. . |
| 5,526,093 | 6/1996 | Takahashi . |
| 5,581,324 | 12/1996 | Miyai et al. . |
| 5,661,546 | 8/1997 | Taniguchi . |
| 5,661,548 | 8/1997 | Imai . |
| 5,719,617 | 2/1998 | Takahashi et al. . |

FOREIGN PATENT DOCUMENTS 63-58349  3/1988  Japan .

*Primary Examiner*—Christopher G. Young
*Attorney, Agent, or Firm*—Fitzpatrick, Cella, Harper & Scinto

[57] ABSTRACT

A projection exposure apparatus includes a projection optical system for projecting a pattern of a reticle, illuminated with exposure light, onto a substrate to be exposed, an optical characteristic predicting device for predicting, in accordance with an equation including a predetermined correction coefficient, an amount of change in optical characteristic produced in the projection optical system as a result of projection of the pattern, an optical characteristic correcting device for correcting the optical characteristic in accordance with the prediction by the predicting device, an optical characteristic measuring device for measuring the amount of change in optical characteristic, a correction coefficient changing device for changing the correction coefficient in accordance with the measurement by the measuring device, a data storing device for storing the correction coefficient, changed by the changing device, as a data related to the reticle, and a control system operable, when a reticle to be used for the exposure is changed, to cause the predicting device to predict the amount of change in optical characteristic by using a correction coefficient in the data storing device corresponding to the reticle to be used.

7 Claims, 4 Drawing Sheets

PROJECTION EXPOSURE METHOD UTILIZING CORRECTION FOR CHANGE IN OPTICAL CHARACTERISTIC

This application is a division of application Ser. No. 08/701,331 filed Aug. 23, 1996, now U.S. Pat. No. 5,801,815.

FIELD OF THE INVENTION AND RELATED ART

This invention relates to a projection exposure apparatus usable in a lithographic process of processes for manufacture of semiconductor devices such as ICs or LSIs, image pickup devices such as CCDs, display devices such as liquid crystal panels, or other devices such as magnetic heads, for example.

In conventional projection exposure apparatuses for manufacture of semiconductor devices such as ICs or LSIs, any change in the position of an image plane of a projection optical system or a change in projection magnification thereof resulting from overheating of the projection optical system due to absorption of energy of exposure light during repetition of projection exposure or resulting from subsequent heat radiation from the projection optical system, is predicted by using an equation wherein a constant peculiar to that projection optical system is added and the total quantity of light passing a reticle pattern and the time necessary for the exposure are used as parameters. Then, in order to correct the change, a wafer stage is moved or a lens of the projection optical system is moved. Alternatively, the pressure between lenses of the projection optical system is controlled.

However, even if the total of the light passing through the reticle pattern is unchanged, in a case where reticles having different types of patterns are used or in a case where an illumination system based on an oblique incidence illumination method is used, the manner of change in optical characteristic is different. Thus, with the method based on calculation, it is not possible to accurately predict changes in optical characteristic of the projection optical system, such as image plane position or projection magnification. Major cause therefor is that light quantity distribution of an optical element or elements of the projection optical system is different and temperature distribution of the projection optical system changes.

Japanese Laid-Open Patent Application, Laid-Open No. 58349/1988 shows a correction method for a case where the change in optical characteristic of a projection optical system deviates from prediction, wherein the change in optical characteristic is directly measured and parameters for correction calculation are changed. However, a difference in parameters due to the difference in type of reticle pattern used is not specified until the change in optical characteristic is measured practically. Thus, there is a problem that the change in optical characteristic deviates from a predicted value before the measurement is completed.

SUMMARY OF THE INVENTION

It is an object of the present invention to provide a projection exposure apparatus by which at least one of the problems described above can be solved.

In accordance with an aspect of the present invention, there is provided a projection exposure apparatus, comprising: a projection optical system for projecting a pattern of a reticle, illuminated with exposure light, onto a substrate to be exposed; optical characteristic predicting means for predicting, in accordance with an equation including a predetermined correction coefficient, an amount of change in optical characteristic produced in the projection optical system as a result of projection of the pattern; optical characteristic correcting means for correcting the optical characteristic in accordance with the prediction by said predicting means; optical characteristic measuring means for measuring the amount of change in optical characteristic; correction coefficient changing means for changing the correction coefficient in accordance with the measurement by said measuring means; data storing means for storing the correction coefficient, changed by said changing means, as a data related to the reticle; and control means operable, when a reticle to be used for the exposure is changed, to cause said predicting means to predict the amount of change in optical characteristic by using a correction coefficient in said data storing means corresponding to the reticle to be used.

Said control means may cause said measuring means to measure optical characteristic of the projection optical system when the amount of change in optical characteristic of the projection optical system as predicted by said predicting means is larger than a predetermined value.

Said optical characteristic correcting means may be operable to move the substrate in a direction parallel to an optical axis of the projection optical system so as to bring the surface of the substrate into coincidence with an imaging plane of the projection optical system.

Said optical characteristic correcting means may include adjusting means for adjusting a state of imaging of the projection optical system, and wherein said adjusting means serves to correct a change in optical characteristic of the projection optical system.

Said adjusting means may be operable to change a focal distance of the projection optical system to adjust an imaging plane of the projection optical system, so as to bring the imaging plane into coincidence with the surface of the substrate.

Said adjusting means may be operable to move one of the reticle and a lens of the projection optical system in a direction parallel to an optical axis of the projection optical system to adjust the projection magnification of the projection optical system.

Said adjusting means may be operable to change a focal distance of the projection optical system to adjust the projection magnification of the projection optical system.

In accordance with another aspect of the present invention, there is provided a projection exposure method, comprising the steps of: projecting, through a projection optical system, a pattern of a reticle, illuminated with exposure light, onto a substrate to be exposed; predicting, in accordance with an equation including a predetermined correction coefficient, an amount of change in optical characteristic produced in the projection optical system as a result of projection of the pattern; correcting the optical characteristic in accordance with the prediction by said predicting step; measuring the amount of change in optical characteristic; changing the correction coefficient in accordance with the measurement by said measuring step; storing the correction coefficient, changed by said changing step, as a data related to the reticle; and executing, when a reticle to be used for the exposure is changed, prediction of the amount of change in optical characteristic by using a stored correction coefficient corresponding to the reticle to be used.

An optical characteristic of the projection optical system may be measured when the amount of change in optical characteristic of the projection optical system as predicted by said predicting step is larger than a predetermined value.

Said optical characteristic correcting step may be arranged to move the substrate in a direction parallel to an optical axis of the projection optical system so as to bring the surface of the substrate into coincidence with an imaging plane of the projection optical system.

Said optical characteristic correcting step may include adjusting a state of imaging of the projection optical system.

Said adjusting step may be arranged to change a focal distance of the projection optical system to adjust an imaging plane of the projection optical system, so as to bring the imaging plane into coincidence with the surface of the substrate.

Said adjusting step may be arranged to move one of the reticle and a lens of the projection optical system in a direction parallel to an optical axis of the projection optical system to adjust the projection magnification of the projection optical system.

Said adjusting step may be arranged to change a focal distance of the projection optical system to adjust the projection magnification of the projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
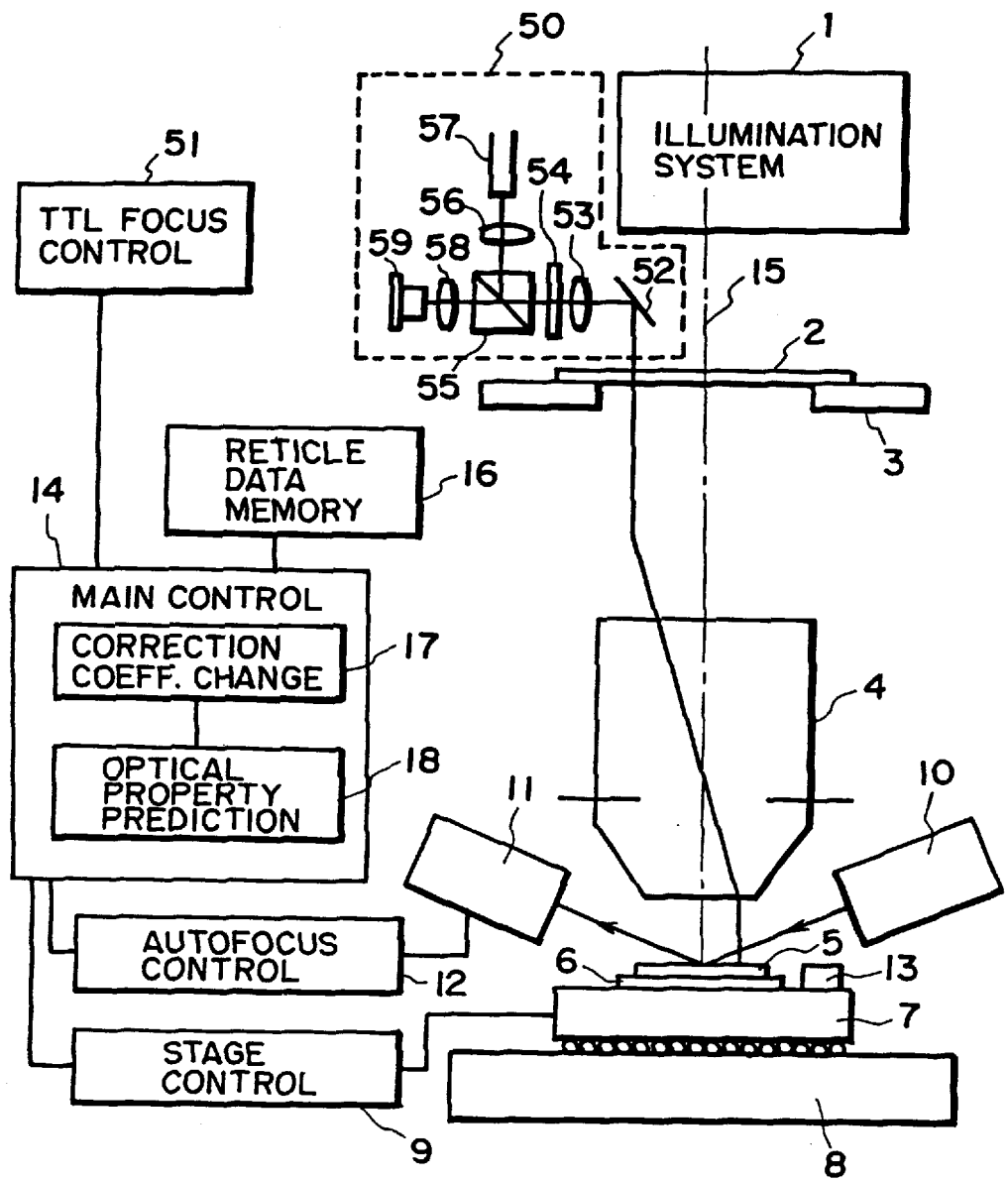
FIG. 1 is a schematic and diagrammatic view of a general structure of a projection exposure apparatus according to a first embodiment of the present invention.

FIG. 1 illustrates a projection exposure apparatus according to a first embodiment of the present invention. Denoted in FIG. 1 at 1 is an illumination system, and denoted at 2 is a reticle on which a device pattern is formed. Denoted at 3 is a reticle stage, and denoted at 4 is a projection optical system for projecting the device pattern of the reticle 2 in a reduced scale. Denoted at 5 is a wafer onto which the device pattern is to be projected. Denoted at 6 is a wafer chuck for holding the wafer 5, and denoted at 7 is an X-Y-Z stage for holding the wafer chuck 5. The X-Y-Z stage 7 is movable two-dimensionally along a plane orthogonal to an optical axis 15, and also it is movable in a direction along the optical axis 15. Denoted at 8 is a base on which the projection optical system 4 and the X-Y-Z stage 7 are mounted. Denoted at 9 is a stage control unit for controlling the operation of the X-Y-Z stage 7. Denoted at 10 and 11 is an autofocus detection system for detecting the position (height) of the wafer 5 surface with respect to the optical axis 15 direction, wherein denoted at 10 is an illumination device for illuminating the wafer 5, and denoted at 11 is a light receiving device for receiving reflection light from the wafer 5 surface and for producing a signal corresponding to the position of the wafer 5 surface with respect to the optical axis 15 direction. Denoted at 12 is a control unit for the autofocus system. Denoted at 13 is a reference flat mirror having a surface placed substantially at the same height as the wafer 5. Denoted at 50 is a TTL focus detecting system for detecting an imaging position (best focus position) of the projection optical system 4, through the projection optical system 4. Denoted at 51 is a control unit for the TTL focus system 50. Denoted at 14 is a control unit which serves to control the apparatus as a whole. The control unit 14 includes optical characteristic predicting means 18 for predicting changes in optical characteristic of the projection optical system 4, and correction coefficient changing means 17 for changing a coefficient or coefficients in prediction calculation on the basis of a measured value of a focal plane of the TTL focus focus system 50. Denoted at 16 is reticle data storing means in which parameters related to reticle 2 are stored.

In the TTL focus system 50, illumination light emitted from a light source (not shown) is directed by a light guiding fiber 57, and light emerges out of a light exit surface of the fiber 57. The illumination light has a wavelength substantially the same as that of exposure light which is to be emitted by the illumination system 1. The light emitted from the fiber 57 is collected by a lens 56 into substantially parallel light. By means of a polarization beam splitter 55, only light of S-polarized component is reflected which is then transformed by a quarter waveplate 54 into circularly polarized light. Then, the light goes by way of an objective lens 53 and a deflection mirror 52, and it illuminates a portion adjacent to a measurement pattern (not shown) formed on the reticle 2 surface.

This illumination light goes through the measurement pattern of the reticle 2 and, through the projection optical system 4, it is reflected by a reflection surface of the reference flat mirror 13. Then, the light goes again through the projection optical system 4 and the measurement pattern of the reticle 4. Thereafter, the light is deflected by the deflection mirror 52 and it is then transformed by the objective lens 53 into substantially parallel light. The light passes through the quarter waveplate 54 by which it is transformed into P-polarized light. The light then goes through the polarization beam splitter 55, and it is collected by a lens 58. Finally, it impinges on the light receiving surface of a light receiving element 59, and the quantity of received light is detected.

Figure 2A:
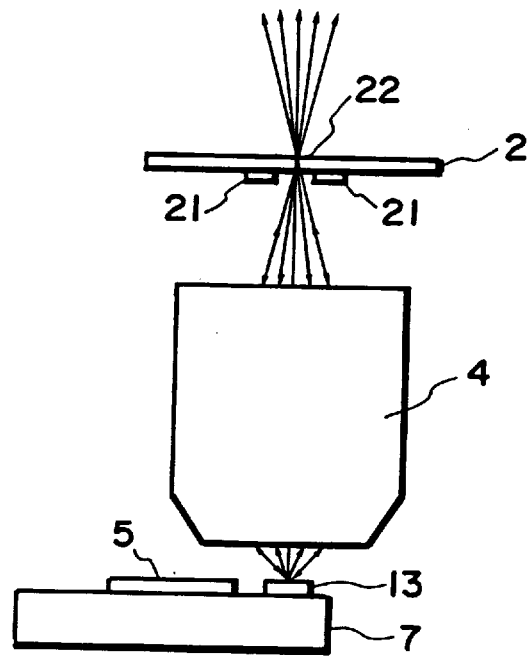
FIGS. 2A and 2B are schematic views for explaining the principle of a TTL focus system in the apparatus of FIG. 1.
Figure 2B:
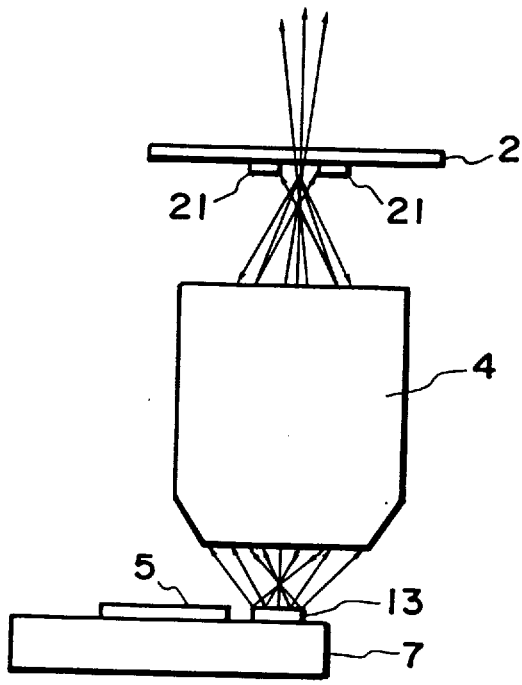

Referring to FIGS. 2A and 2B, the manner of calculating the focal plane of the projection optical system 4 by using the TTL focus system 50 will be explained. In FIGS. 2A and 2B, denoted at 21 are pattern portions formed on the reticle 2 and having a light blocking property. Denoted at 22 is a transmissive portion which is sandwiched by the pattern portions 21. Here, for detection of the focus position of the projection optical system 4, the X-Y-Z stage 7 is moved along the optical axis direction of the projection optical system 4. The reference flat mirror 13 is positioned on the optical axis of the projection optical system.

FIG. 2A shows a case where the reflection surface of the reference flat mirror 13 is on the focal plane of the projection optical system 4. In this drawing, the illumination light from the TTL focus system 50 and having passed through the transmissive portion 22 of the reticle 2, is collected on and reflected by the reflection surface of the reference flat mirror 13. The reflected illumination light goes back along the oncoming path and, after passing the projection optical system 4, it is collected on the reticle 2. The light then passes the transmissive portion 22 of-the reticle 2. Here, all the illumination light goes through the transmissive portion 22 without being eclipsed by the pattern portions 21 of the reticle 2.

FIG. 2B shows a case where the reflection surface of the reference flat mirror 13 is deviated from the focal plane of the projection optical system 4. In this drawing, the illumination light having passed through the transmissive portion 22 of the reticle 2 goes through the projection optical system 4 and impinges on the reflection surface of the reference flat mirror 13. However, since the reflection surface of the reference flat mirror is not on the focal plane of the projection optical system 4, the illumination light is reflected by this reflection surface into divergent light. Namely, the reflected illumination light goes along a path difference from its oncoming path and passes the projection optical system 4. The light impinges on the reticle 2 without being converged thereon, but having an expansion corresponding to the amount of deviation of the reflection surface of the reference flat mirror 13 from the focal plane of the projection optical system. Here, the illumination light is partially eclipsed by the pattern portions 22 of the reticle 2. Thus, between a case where the reference flat mirror 13 is coincident with the focal plane of the projection optical system 4 and a case where it is not so, there is a difference in quantity of light which passes the reticle 2 and which is then received by the light receiving element 59 of the TTL focus system 50.

Figure 3:
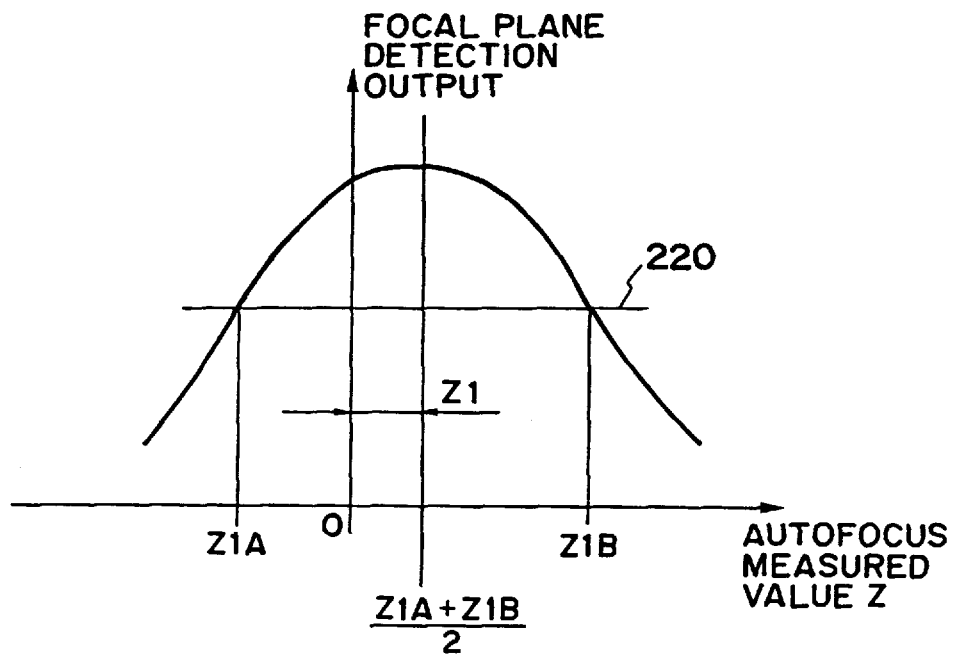
FIG. 3 is a graph for explaining an output signal of the TTL focus system in the apparatus of FIG. 1.

Detection of the focal plane of the projection optical system 4 is determined by an output signal of the TTL focus system corresponding to the position of the reference flat mirror 13 with respect to the optical axis direction. As an example therefor, as shown in FIG. 3, a slice level 220 of a certain proportion to a peak output may be set and the focus position $Z_1$ may be determined as $Z_1=(Z_{1A}+Z_{1B})/2$ wherein $Z_{1A}$ and $Z_{1B}$ are measured values which represent the output of the slice level 220 and which are detected by measurement. Alternatively, the peak position may be determined on the basis of a differentiation method.

Next, in the projection exposure apparatus of FIG. 1, the operation for correcting a change in optical characteristic of the projection optical system due to irradiation with exposure light during sequential projection exposures of a circuit pattern of a reticle 2 onto a wafer 5, will be explained.

The main control unit 14 serves to operate conveying means so that a reticle 2 having a circuit pattern to be printed is conveyed out of a reticle cassette (not shown) and onto the reticle stage 3. Here, the reticle 2 is placed in alignment with a mark (not shown) formed on the reticle stage 3. Also, data of the reticle 2 such as information related to the transmissivity of the reticle or the position of the mark, for example, is loaded to the main control unit 14 from the reticle data storing means. Subsequently, a wafer conveying system conveys a wafer 5 out of a wafer cassette (not shown) and, after wafer prealignment, that is, rough alignment, the wafer is attracted by the wafer chuck 6. Then, the main control unit receives the information related to the positions of the shots of the wafer, and it controls the positions of the shots on the basis of the received information in accordance with the global alignment method and by using the stage control system 9.

As the wafer 5 is moved to the first shot position, the level of the wafer 5 surface with respect to the optical axis 15 direction is measured by means of the autofocus system 10 and 11, and the X-Y-Z stage 7 is moved along the optical axis 15 direction so that the wafer is brought into coincidence with the focus surface of the projection optical system 4, by which focusing of the wafer 5 is accomplished. Subsequently, the wafer is exposed with correct amount of exposure from the illumination system 1, and an image of the circuit pattern of the reticle 2 is formed in a photosensitive material applied to the wafer 5, by means of the projection optical system 4. As the exposure of the first shot is completed, the X-Y-Z stage 7 is moved so that the next shot position comes to the exposure position. Then, focusing and exposure operations are carried out similarly to the first shot. In this manner, all the shots of the wafer are exposed and, after that, the wafer 5 is unloaded and is collected into a wafer cassette (not shown), and a subsequent wafer 5 is placed on the wafer chuck 6.

In such exposure process, a portion of light energy applied to the projection optical system 4 is absorbed by optical elements of the projection optical system 4 by which the temperature of the optical elements rises. Thus, the optical characteristic of the projection optical system 4 changes with the exposure process. The main control unit 14 cooperates with optical characteristic predicting means 18 to predict such change in optical characteristic, and it operates to supply an offset corresponding to the predicted value to the autofocus controlling means 12. In response, the stage control means 9 operates so that the wafer 5 surface is placed constantly at the focus position of the projection optical system 4. The main control unit 14 fetches parameters for the calculation of this amount of change. The parameters include opening/closing time of a shutter (not shown) of the illumination system 1 (that is, the exposure time t), the time t' between successive exposures, the illumination range of the illumination system 1, the illuminance, the light quantity QD as calculated from the transmissivity of the reticle 2, a coefficient Da peculiar to each reticle, and so on.

The optical characteristic predicting means 18 predicts a change in optical characteristic during repetition of exposures, from these parameters and a coefficient having been set in the apparatus. The calculation will be explained while taking a change $\Delta F$ of the focus position of the projection optical system 4 as an example. The calculation uses the following equations:

$$\Delta F = \Delta F1 + \Delta F2 \quad (1)$$

$$\Delta F1 = SF \cdot QD \cdot Da \cdot DT \quad (2)$$

$$\Delta F2 = -\Delta F' \cdot \exp(-k_F \cdot t) \quad (3)$$

wherein SF is a proportional constant, QD is a parameter corresponding to the total quantity of light passed through the circuit pattern, Da is a correction coefficient peculiar to a particular reticle to be used and having been stored in the reticle data storing means 16, DT is the proportion of time in which the shutter is held opened in unit time, and $k_F$ is a parameter which represents thermal conduction of optical elements of the projection optical system 4. $\Delta F'$ is the amount of change in focus position of the projection optical system 4 as calculated in the preceding unit time, $\Delta F1$ is the amount of change in focus position per unit time, due to heat absorption of the projection optical system 4, and $\Delta F2$ is the amount of change in focal plane per unit time, due to heat radiation from the projection optical system 4. $\Delta F2$ may be expressed in the form of linear coupling of plural terms.

Figure 4:
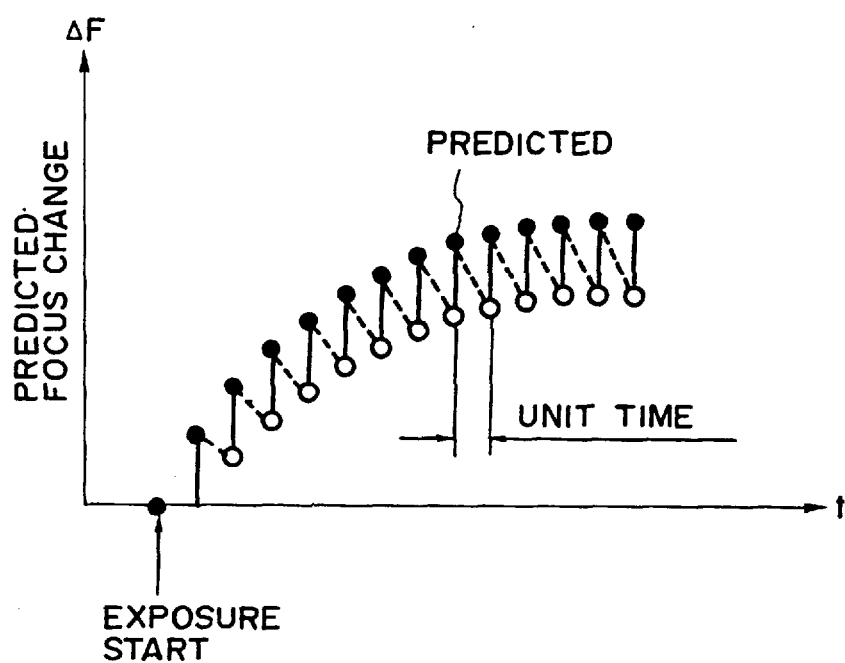
FIG. 4 is a graph for explaining a result of prediction of focus change due to exposure, in the apparatus of FIG. 1.

The calculation in the optical characteristic predicting means 18 is repeated and carried out successively for every unit time. The amount of change in focus position of the projection optical system 4 obtainable with these calculations changes as seen in FIG. 4 in which the envelope changes along a curve which can be represented by a function of natural logarithm. Along this, the X-Y-Z stage 7 is moved so that the position of the wafer 5 with respect to the optical axis 15 direction as measured by the autofocus system 10 and 11 corresponds to the amount of change as calculated by the optical characteristic predicting means 18, by which the wafer becomes coincident with the focal surface of the projection optical system 4.

The amount of change of the focal surface as calculated by the optical characteristic predicting means 18 is a predicted value calculated from the parameters introduced into the main control unit 14. If there are errors in them, in accumulation there occurs an error between a predicted value and the amount of change which error leads to failure of good correction. Particularly, diffraction light distribution or pattern placement of each reticle have a large influence. In consideration of this, in this embodiment, the focal plane of the projection optical system 4 is measured by means of the TTL focus system 50 of FIG. 1, and a correction coefficient Da is changed for every reticle in accordance with equation (2).

Details of this correction will be explained below.

The measurement through the TTL focus system 50 is executed in the manner as illustrated in FIGS. 2 and 3. While the measurement may be set so that one measurement operation is effected for every wafer or for every N wafers, since the error included in the predicted amount of change is proportional to the amount of change, the measurement is executed when a prediction result ΔF becomes larger than a predetermined value. By setting the measurement timing in this manner, the measurement is executed frequently when the change is large and, if the change becomes saturated to some extent, there is no need of measurement and only the measurement through the TTL focus system 50 is executed. This is effective to suppress throughput decrease to minimum. For example, while taking F0 as the value for determining measurement timing, one measurement operation may be executed when a change ΔF of predicted value after the preceding measurement through the TTL focus system comes to satisfy a relation ΔF>F0.

If the result of measurement through the TTL focus system 50 is larger than a tolerable value, the correction coefficient changing means 17 changes the correction coefficient. This is based on calculation in accordance with equations below:

$$Da(\text{NEW}) = \{\alpha + \beta \cdot (\Delta F + Fa)/\Delta F\} \cdot Da \quad (4)$$

$$\alpha + \beta = 1 \quad (5)$$

wherein ΔF corresponds to a predicted value of focus change as calculated by the optical system predicting means 18 just before measurement of the focus position through the TTL focus system 50, and it corresponds to the amount of change occurred from the preceding measurement. Fa is the difference between the predicted value and the focal surface as measured by the TTL focus system 50, and Da is the correction coefficient for the reticle having been used in the prediction calculation. Da(NEW) is a new coefficient provided by changing the coefficient by the correction coefficient changing means 17. It is a constant that satisfy equation (5) and it is so determined that Da is converged. The new reticle correction coefficient Da(NEW) as having been changed by the correction coefficient changing means 17 is supplied to the optical characteristic predicting means 18, and thus the prediction calculation after that is made by using this coefficient and in accordance with equations (1)–(3).

The above-described operations are repeated and, when exposures of wafers of one lot are completed, the reticle 2 is unloaded and stored into a reticle cassette (not shown). Simultaneously, the latest correction coefficient Da having been used in the optical characteristic predicting means 18 is stored into the reticle data storing means 16. If subsequent exposures are to be made by using the same reticle, the latest correction coefficient Da is used. That is, when a reticle to be used for the exposure is changed, the main control unit supplies a latest correction coefficient Da corresponding to a reticle which is just going to be used, stored in the reticle data storing means, to the optical characteristic predicting means 18. Thus, the optical characteristic predicting means predicts the optical characteristic on the basis of the supplied data.

When a certain reticle is to be used first, a correction coefficient related to transmissivity distribution or diffraction light distribution of that reticle is not fixed. Thus, Da=1 is set as an initial value. When a reticle is used plural times, Da may be converged to a certain value. In that occasion, the difference between the actual focus position and the amount of change of focus position as calculated by the optical characteristic predicting means 18 will become smaller. For this reason, the number of measurement operations through the TTL focus system 50 may be decreased, to enhance the throughput. For example, if the amount of change in Da before and after exposures of one lot becomes less than a predetermined value, the value of F0 in the main control unit 14 may be enlarged.

In the apparatus of FIG. 1, the change in focus position of the projection optical system 4 resulting from the exposure is predicted by the optical characteristic predicting means 18 and the X-Y-Z stage 7 is moved along the optical axis 15 direction so that the predicted focus position coincides with the wafer 5 surface. However, in place of it, an adjusting mechanism is used by which the focal length of the projection optical system 4 is changed to cancel the change in focus position due to the exposure, to thereby maintain the focus at a constant position continuously. For changing the focal length, there is a known method for changing the refractivity of a space between particular lenses of a projection optical system by adjusting the pressure in that portion. In this example, the relation between the focus position and the pressure in the space between the lenses may be detected beforehand, and the pressure may be controlled in accordance with a predicted value ΔF of the change in focus position, by which the focus position may be maintained constant.

As a method for detecting the focus position of the projection optical system 4 in accordance with TTL procedure, in place of the method shown in FIG. 1, a light receiving portion having a transmitting area of analogous shape to the measurement pattern of the reticle 2 and having a size corresponding to the reduction magnification ratio of the projection optical system 4, to the measurement pattern of the reticle, may be formed on the X-Y-Z stage 7. In that occasion, the principle of detecting the focus position is essentially the same as having been explained with reference to FIG. 3.

Figure 5:
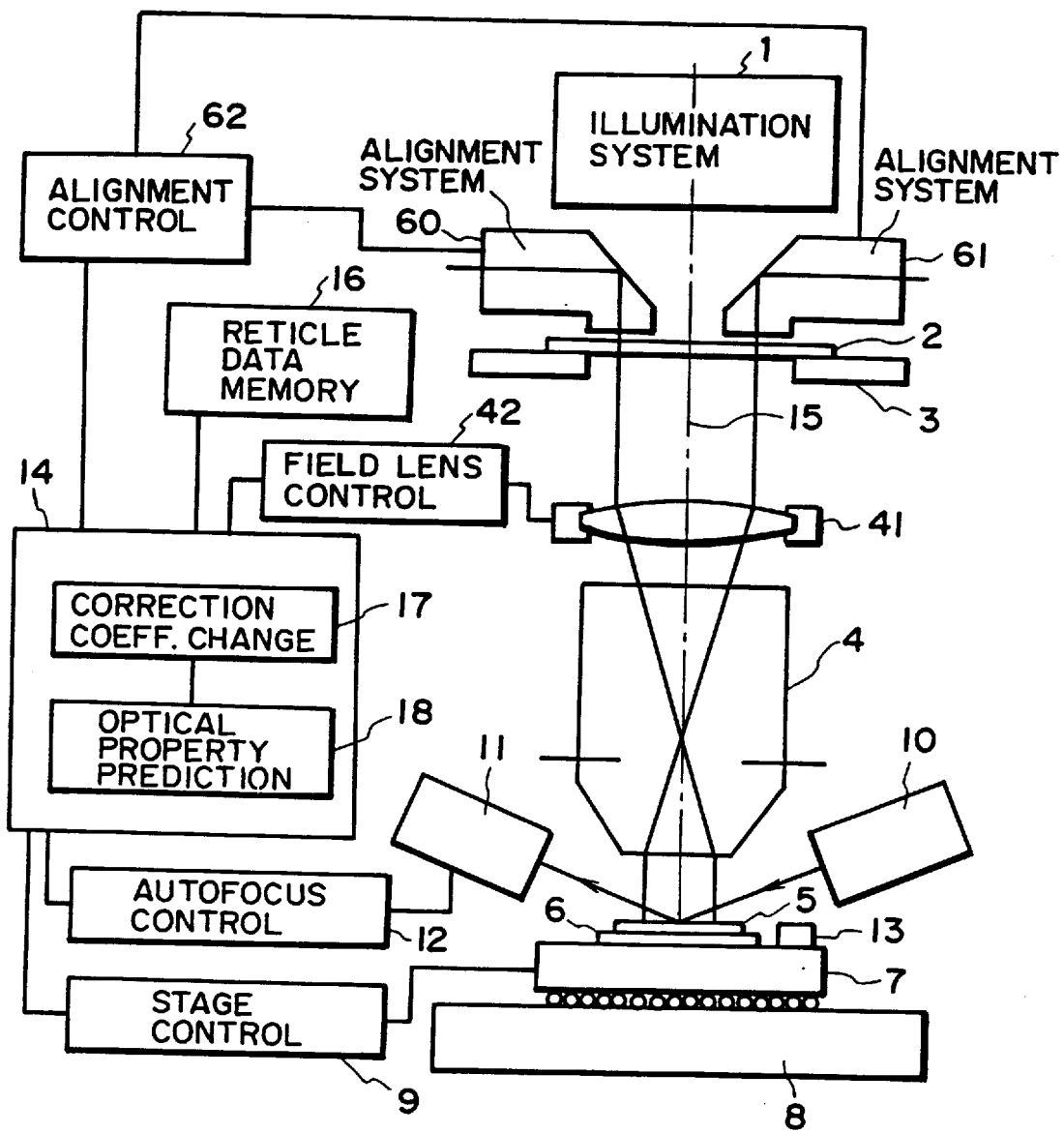
FIG. 5 is a schematic and diagrammatic view of a general structure of a projection exposure apparatus according to a second embodiment of the present invention.

FIG. 5 illustrates a general structure of a projection exposure apparatus according to a second embodiment of the present invention. With reference to the second embodiment, a correction method for a case where the reduction magnification of a projection optical system changes with exposures. In FIG. 5, denoted at 60 and 61 are TTL type alignment systems, and denoted at 62 is an alignment control system for calculating a positional deviation of the alignment system from their measured values or for calculating an error in the reduction magnification. Denoted at 41 is a field lens of the projection optical system 4, and it can be moved along the optical axis 15 direction by a driving mechanism (not shown) in response to a signal from a field lens control means 42, by which the reduction magnification of the projection optical system 4 can be adjusted.

As regards measurement of the reduction magnification of the projection optical system 4, a reference mark provided in a portion of the reference flat mirror 13 is moved by means of the X-Y-Z stage 7, and an error in the reduction magnification can be detected on the basis of a relative position of two different points, whereat the alignment systems 60 and 61 detect relative position of the reference mark to marks of the reticle, provided at different positions on the reticle, as well as on the basis of the coordinate of the X-Y-Z stage between these two points and the coordinate of the marks of the reticle 2.

The amount of change in reduction magnification resulting from repetition of exposures can be predicted by calculation through the optical characteristic predicting means 18 in accordance with equations (6)–(8) below, similar to equations (1)–(3):

$$\Delta B = \Delta B1 + \Delta B2 \qquad (6)$$

$$\Delta B1 = SB \cdot QD \cdot Db \cdot DT \qquad (7)$$

$$\Delta B2 = -\Delta B' \cdot \exp(-k_B \cdot t) \qquad (8)$$

wherein SB is a proportional constant, Db is a correction coefficient peculiar to a reticle used and having been stored in the reticle data storing means 16, DT is the proportion of time in which the shutter is held opened during a unit time of calculation, and $k_B$ is a parameter which represents thermal conduction of optical elements of the projection optical system 4. $\Delta B'$ is the amount of change in reduction magnification of the projection optical system 4 as calculated in the preceding unit time. $\Delta B1$ is the amount of change in reduction magnification per unit time resulting from heat absorption of the projection optical system 4, and $\Delta B2$ is the amount of change per unit time due to thermal radiation of the projection optical system 4.

When the change in reduction magnification of the projection optical system 4 as calculated by the optical characteristic predicting means 18 goes beyond a predetermined value, the main control unit 14 supplies a signal to the field lens controlling means 42 to move the field lens 41 to thereby adjust and correct the change in reduction magnification. Also in that case, since there occurs an error in the prediction calculation if the transmissivity distribution or diffraction light distribution is different for every reticle 2, the reduction magnification of the projection optical system 4 is measured at a predetermined timing or interval to sequentially change the correction coefficient Db. This assures enhancement of precision of prediction calculation. The correction coefficient Db is determined in accordance with equation (9) below, similar to equation (4) having been explained with reference to the first embodiment:

$$Db(\text{NEW}) = \{\alpha + \beta \cdot (\Delta B + Ba)/\Delta B\} \cdot Db \qquad (9)$$

wherein $\alpha + \beta = 1$. $\Delta B$ is a predicted value just before measurement of the reduction magnification through the alignment systems 60–62, and Ba is a reduction magnification of the projection optical system 4 as measured through the alignment systems 60–62. As regards the measurement timing, it may be so set that one measurement operation is executed every time $\Delta B$ changes by a predetermined amount from the predicted value just before the preceding measurement. This is effective to minimize the number of measurement operations, and thus it is most efficient.

As regards the adjustment of the reduction magnification, in place of the one shown in FIG. 5, when the projection optical system is not telecentric on the reticle side, the reticle may effectively be moved to change the spacing between the reticle and the projection optical system. Also, the pressure between particular lenses may be adjusted to change the reduction magnification.

In the first and second embodiments described hereinbefore, the focus correction and the reduction magnification correction are carried out separately. However, the structure may be modified to execute both of them. Further, the optical characteristic to be corrected is not limited to the focus or reduction magnification.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure method for manufacturing devices, comprising the steps of:

projecting, through a projection optical system, a pattern of a reticle, illuminated with exposure light, onto a substrate to be exposed;

predicting, in accordance with an equation including a predetermined correction coefficient, an amount of change in optical characteristic produced in the projection optical system as a result of projection of the pattern;

correcting the optical characteristic in accordance with the prediction by said predicting step;

measuring the amount of change in optical characteristic;

changing the correction coefficient in accordance with the measurement by said measuring step;

storing a latest correction coefficient, changed by said changing step, as data related to the reticle; and executing, when a reticle to be used for the exposure is changed, prediction of the amount of change in optical characteristic by using a stored correction coefficient corresponding to the reticle to be used, which is selected from a plurality of correction coefficients stored by said storing step.

2. A method according to claim 1, wherein an optical characteristic of the projection optical system is measured when the amount of change in optical characteristic of the projection optical system as predicted by said predicting step is larger than a predetermined value.

3. A method according to claim 1, wherein said optical characteristic correcting step is arranged to move the substrate in a direction parallel to an optical axis of the projection optical system so as to bring the surface of the substrate into coincidence with an imaging plane of the projection optical system.

4. A method according to claim 1, wherein said optical characteristic correcting step includes adjusting a state of imaging of the projection optical system.

5. A method according to claim 4, wherein said adjusting step is arranged to change a focal distance of the projection optical system to adjust an imaging plane of the projection optical system, so as to bring the imaging plane into coincidence with the surface of the substrate.

6. A method according to claim 4, wherein said adjusting step is arranged to move one of the reticle and a lens of the projection optical system in a direction parallel to an optical axis of the projection optical system to adjust the projection magnification of the projection optical system.

7. A method according to claim 4, wherein said adjusting step is arranged to change a focal distance of the projection optical system to adjust the projection magnification of the projection optical system.

* * * * *

UNITED STATES PATENT AND TRADEMARK OFFICE
CERTIFICATE OF CORRECTION

PATENT NO. : 5,879,845

DATED : March 9, 1999

INVENTOR : KAZUHIRO TAKAHASHI

It is certified that error appears in the above-identified patent and that said Letters Patent is hereby corrected as shown below:

COLUMN 4:

line 17, "focus focus" should read --focus--.

COLUMN 5:

line 2, "of-the" should read --of the--.

COLUMN 7:

line 58, "satisfy" should read --satisfies--.

Signed and Sealed this

Twenty-eighth Day of September, 1999

Attest:

Q. TODD DICKINSON

*Attesting Officer*     *Acting Commissioner of Patents and Trademarks*